(12) United States Patent
Ishidao et al.

(10) Patent No.: US 6,987,297 B2
(45) Date of Patent: Jan. 17, 2006

(54) SEMICONDUCTOR MEMORY DEVICE AND MANUFACTURING METHOD THEREOF

(75) Inventors: Masaki Ishidao, Atsugi (JP); Masahiro Kobayashi, Kawasaki (JP); Masatoshi Fukuda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 76 days.

(21) Appl. No.: 10/768,188

(22) Filed: Feb. 2, 2004
(Under 37 CFR 1.47)

(65) Prior Publication Data

US 2004/0218413 A1    Nov. 4, 2004

(30) Foreign Application Priority Data

Feb. 4, 2003    (JP)    .............................. 2003-027514

(51) Int. Cl.
*H01L 29/788* (2006.01)
(52) U.S. Cl. ........................ 257/316; 257/315; 257/321
(58) Field of Classification Search ......... 257/314–326
See application file for complete search history.

(56) References Cited

U.S. PATENT DOCUMENTS

| 2003/0080372 A1 * | 5/2003 | Mikolajick | .................. 257/315 |
| 2005/0082599 A1 * | 4/2005 | Forbes | ........................ 257/316 |

OTHER PUBLICATIONS

Patent Abstracts of Japan, Publication No. 2001168219, dated Jun. 22, 2001.

* cited by examiner

*Primary Examiner*—Ngân V. Ngô
(74) *Attorney, Agent, or Firm*—Westerman, Hattori, Daniels & Adrian, LLP

(57) ABSTRACT

A polysilicon film and the like are patterned to form n⁻ diffusion layers on a silicon substrate. Subsequently, an outer edge of an $Al_2O_3$ film is made retreat to be smaller than that of a gate electrode by performing isotropic etching of the $Al_2O_3$ film, using a solution of sulfuric acid with hydrogen peroxide. A silicon oxide film, a silicon nitride film, the polysilicon film and the like are hardly removed although the solution of sulfuric acid with hydrogen peroxide exhibits higher etching rate to the $Al_2O_3$ film, enabling almost exclusive etching of the $Al_2O_3$ film at a high selectivity ratio. Subsequently, another polysilicon film is formed so as to fill spaces formed after the retreat of the $Al_2O_3$ film under the silicon oxide film. Subsequently, a sidewall insulating film is formed by remaining portions of the later polysilicon film in the spaces by performing RIE, oxidation, or the like of the later polysilicon film.

9 Claims, 4 Drawing Sheets

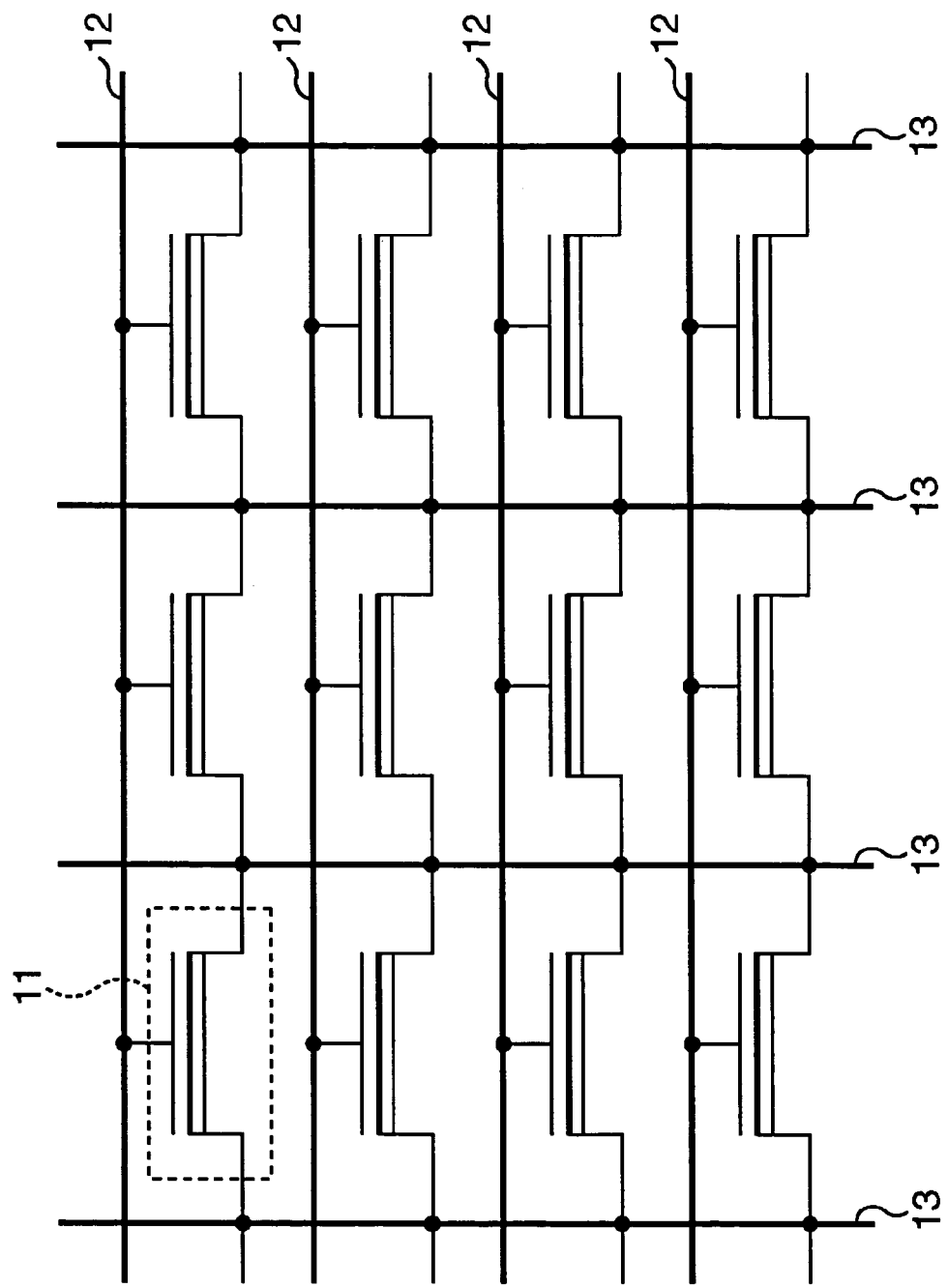

SEMICONDUCTOR MEMORY DEVICE AND MANUFACTURING METHOD THEREOF

CROSS-REFERENCE TO RELATED APPLICATIONS

This application is based upon and claims the benefit of priority from the prior Japanese Patent Application No. 2003-027514, filed on Feb. 4, 2003, the entire contents of which are incorporated herein by reference.

BACKGROUND OF THE INVENTION

1. Field of the Invention

The present invention relates to a semiconductor memory device suitable for a multi-value flash memory of which charge storage layers are spatially separated, and a manufacturing method thereof.

2. Description of the Related Art

Conventionally, there has been such a limitation in a multi-value flash memory that electron injection during write operation in a memory cell of MONOS (Metal/Oxide/Nitride/Oxide/Semiconductor) structure is possible only in the regions at both ends of a gate; thereby electrons which are injected into traps of a nitrided film are accumulated. These accumulated electrons cause a shift in a threshold voltage of a cell transistor. As a result, an electric current value of the cell transistor during read operation may vary to "1" or "0(zero)" in terms of information.

Generally, in such an element structure, such electrons as injected and held in a source side of the cell transistor largely affect the shift of the threshold voltage of the cell transistor. Therefore, it is possible to obtain two bits of information, which is represented as four values: "00", "01", "10", and "11", in one memory cell by conducting read operation of the state of accumulated electrons of both ends of the gate twice at the source and at a drain by turns.

In a memory cell of conventional structure, there is placed a charge storing film, commonly a silicon nitride film, over the whole area of the gate, thereby charge redistribution may occur. The charge redistribution may vary the shifting amount of the threshold voltage and concurrently rewrite information of the other side of the gate, resulting in further readout error.

Accordingly, such an approach has been developed in order to prevent the charge redistribution that a charge storage layer is electrically divided into portions, and charge storing layers formed at both ends of the gate and a control gate are so formed as in a self-aligned manner. In this approach, charge is to be stored at both ends of the gate of the charge storage layers, so that charge redistribution is prevented by forming a separation oxide film.

In the prior art, when such a separation oxide film is formed, first, an oxide film as a material film of the separation oxide film, an oxide film for an ONO film, and a polysilicon film (polycrystalline silicon film) for a gate electrode are formed sequentially on a tunnel oxide film. After that, the polysilicon film and the two oxide films are processed to take shape of a gate by anisotropic etching such as RIE (reactive ion etching) or the like. In the course of the process, overetching is conducted to the oxide films thereby an outer edge portion of the oxide film, which is used as the material film of the separation oxide film, is made retreat, so that the separation oxide film is formed.

A prior art is disclosed in Japanese Patent Laid-open No. 2001-168219.

SUMMARY OF THE INVENTION

After diligent efforts, the present inventors devised the following embodiment.

In a first semiconductor memory device relating to the present invention, a semiconductor substrate and a tunnel insulating film formed on the semiconductor substrate are provided. An $Al_2O_3$ film is formed, and further, a pair of charge storage layers sandwiching the $Al_2O_3$ film therebetween in plain view are formed on the tunnel insulating film. An insulating film is formed on the $Al_2O_3$ film and the pair of charge storage layers, and a gate electrode is formed on the insulating film. A source region and a drain region sandwiching the gate electrode in plain view are formed as a pair on a surface of the semiconductor substrate.

A second semiconductor memory device relating to the present invention is intended for a semiconductor memory device having a pair of charge storage layers in each memory cell thereof and being capable of storing four values. Furthermore, an $Al_2O_3$ film insulating the pair of charge storage layers with each other is provided.

According to a manufacturing method of the semiconductor memory device relating to the present invention, first, a tunnel insulating film is formed on a semiconductor substrate, and an $Al_2O_3$ film, an insulating film, and a material film of a gate electrode are formed sequentially on the tunnel insulating film. After that, the gate electrode is formed by processing the material film of the gate electrode, the insulating film, and the $Al_2O_3$ film into a planar shape of the gate electrode, and an outer edge of the $Al_2O_3$ film is made retreat to be smaller than an outer edge of the gate electrode by performing isotropic etching to the $Al_2O_3$ film so as to form a pair of spaces under the insulating film. Subsequently, charge storage layers are respectively formed in the pair of spaces, and a source region and a drain region sandwiching the gate electrode in plain view are formed as a pair on the surface of the semiconductor substrate. Note that the tunnel insulating film may be formed by oxidizing the surface of the semiconductor substrate, that is, the tunnel insulating film may be formed in any manner provided that the same is positioned on the semiconductor substrate in consequence. Also, the paired source and drain region may be formed before forming the charge storage layers to the extent that the material film of the gate electrode, the insulating film, and the $Al_2O_3$ film have been processed therebefore.

BRIEF DESCRIPTION OF THE DRAWINGS

FIG. 2 is a circuit diagram showing a configuration of a memory cell array of the multi-value flash memory.

DETAILED DESCRIPTION OF THE PREFERRED EMBODIMENTS

As described above, in a conventional method, an outer edge portion of the oxide film is made retreat by overetching. However, it is hard to control overetching amount in the course of RIE. In addition, although thermal oxidation treatment is required, repeatability thereof among wafers or lots is insufficient in the aforementioned prior art due to the gate structure in which gate processing and heat treatment are extremely difficult to control. As a result, throughput and yield stay in a low level, and stability (reliability) in two-bit operation cannot be said satisfying as well.

An object of the present invention is to provide a semiconductor memory device capable of storing two bits of information per memory cell and a manufacturing method thereof, the semiconductor memory device enabling high throughput, yield, and reliability.

Hereinafter, concrete description of a semiconductor memory device and a manufacturing method thereof relating to an embodiment of the present invention will be given with reference to the accompanying drawings. Note that a configuration of each memory cell will be described here with the manufacturing method thereof for convenience. FIGS. 1A to 1F are sectional views showing a manufacturing method of a multi-value flash memory (semiconductor memory device) relating to the embodiment of the present invention sequentially by process.

Figure 1A:
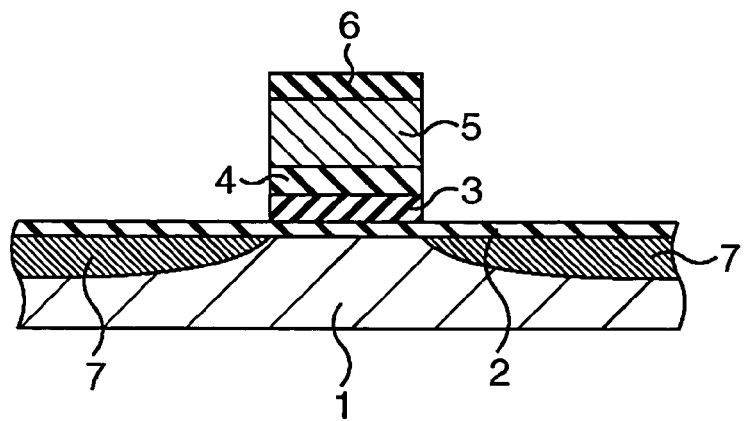
FIGS. 1A to 1F are sectional views showing a manufacturing method of a multi-value flash memory relating to an embodiment of the present invention sequentially by process.

According to the present embodiment, as shown in FIG. 1A, first, a tunnel insulating film (tunnel oxide film) 2, an $Al_2O_3$ film 3, a silicon oxide film 4, a polysilicon film (polycrystalline silicon film) 5, and a cap film 6 are formed sequentially on a semiconductor substrate, for example, a silicon substrate 1. The tunnel oxide film 2 has a thickness for example of 3 nm to 9 nm. The $Al_2O_3$ film 3 has a thickness for example of 5 nm to 15 nm. The silicon oxide film 4 has a thickness for example of 10 nm. The polysilicon film 5 has a thickness for example of 180 nm. Further, the cap film 6 is composed of a silicon oxide film or a silicon nitride film as an example.

Next, the cap film 6, the polysilicon film 5, the silicon oxide film 4, and the $Al_2O_3$ film 3 are patterned into a planar shape of a gate electrode. As a result, a gate electrode is configured by the polysilicon film 5. After that, ion injection is performed using the patterned cap film 6 and the like as a mask to form for example $n^-$ diffusion layers 7 on a surface of the silicon substrate 1.

Figure 1B:
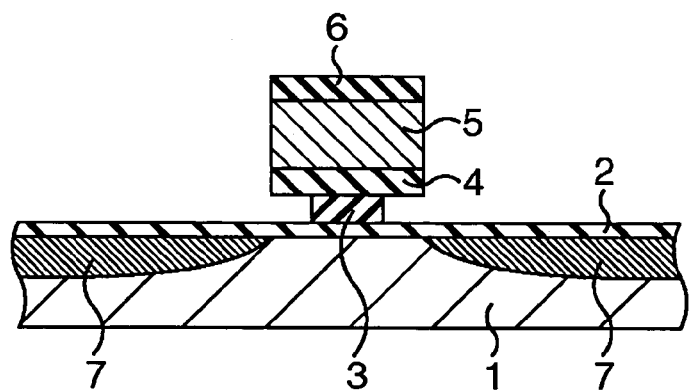

As shown in FIG. 1B, thereafter, isotropic etching of the $Al_2O_3$ film 3 is performed to retreat an outer edge of the $Al_2O_3$ film 3 to be smaller than that of the gate electrode (patterned polysilicon film 5). In the isotropic etching, a solution of sulfuric acid with hydrogen peroxide is used as an example. The solution of sulfuric acid with hydrogen peroxide exhibits higher etching rate to the $Al_2O_3$ film 3, while the silicon oxide film, the silicon nitride film, the polysilicon film, and the like are hardly removed, enabling almost exclusive etching of the $Al_2O_3$ film 3 at a high selectivity ratio.

Figure 1C:
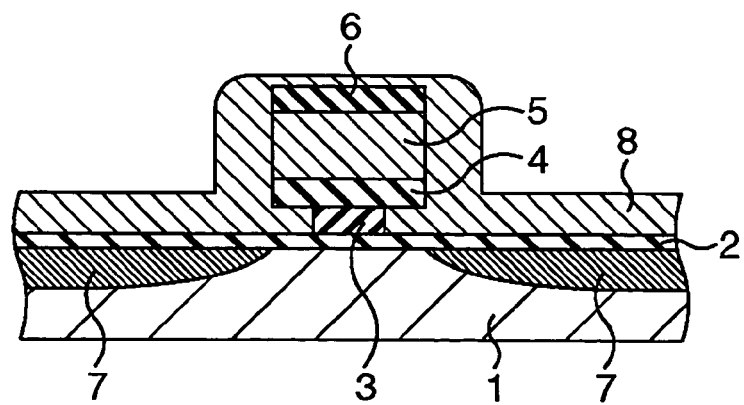

Subsequently, as shown in FIG. 1C, a conductor film, which is capable of holding an electron that is injected thereinto from a channel, is formed all over surface. According to the present embodiment, as an example of such a conductor film, a polysilicon film 8 is formed. In the formation, the polysilicon film 8 is formed to fill spaces under the silicon oxide film 4, the spaces being formed when the $Al_2O_3$ film 3 is made retreat. Such a polysilicon film 8 can be formed, for example, by atmospheric pressure CVD method.

Figure 1D:
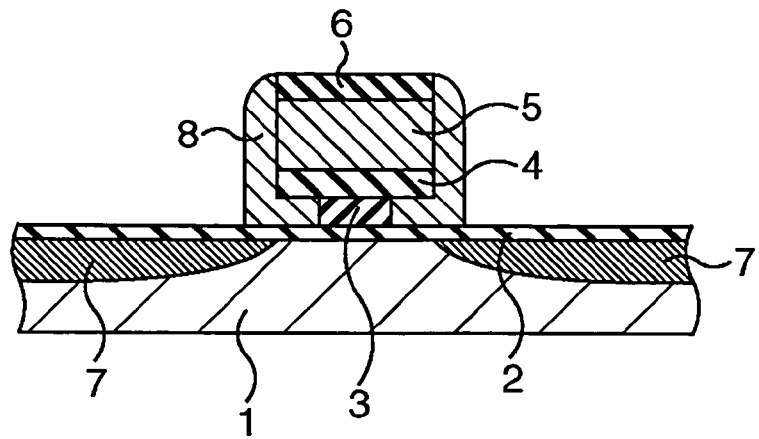

Subsequently, as shown in FIG. 1D, the polysilicon film 8 is processed by anisotropic etching, for example, RIE so that the polysilicon films 8 each having a predetermined thickness (thickness in terms of not vertical direction but horizontal direction) are remained on the side portions of the polysilicon film 5 and the like. At this time, the polysilicon films 8 are also made remain in the spaces under the silicon oxide film 4, the spaces being formed when the $Al_2O_3$ film 3 is made retreat. The polysilicon films 8 to be remained on the side portions of the polysilicon film 5 and the like have the same thickness as of a sidewall for forming an LDD structure, as an example.

Figure 1E:
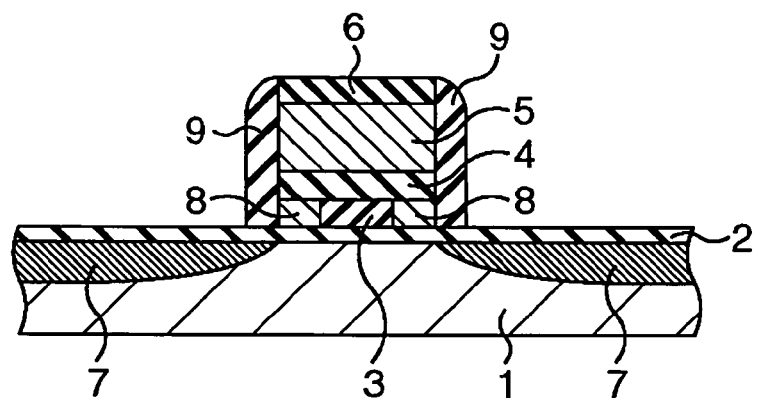

Subsequently, thermal oxidation method is performed to oxidize portions of the polysilicon films 8 except portions in the spaces formed under the silicon oxide film 4 when the $Al_2O_3$ film 3 is made retreat. Consequently, as shown in FIG. 1E, sidewall oxide films (sidewall insulating films) 9 are formed.

Figure 1F:
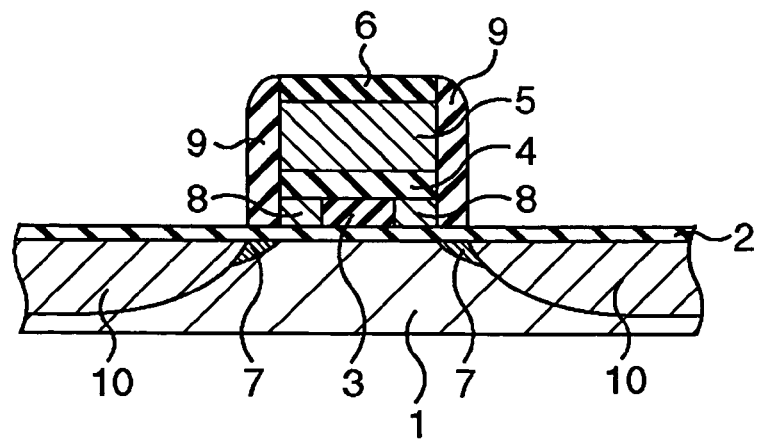

Subsequently, as shown in FIG. 1F, ion implantation is performed at a higher concentration ratio than that employed when the $n^-$ diffusion layers 7 are formed to thereby form, for example, $n^+$ diffusion layers 10 on the surface of the silicon substrate 1 using the cap film 6 and the sidewall oxide films 9 as a mask. With the $n^-$ diffusion layers 7 and the $n^+$ diffusion layers 10, a source and drain region of the LDD structure is configured.

After that, an interlayer insulating film, a contact hole, a wiring or the like are formed to complete the multi-value flash memory.

FIG. 2 is a circuit diagram showing a configuration of a memory cell array of the multi-value flash memory. The memory cell array is composed of a plurality of memory cells 11 arranged, the memory cells 11 being formed in the above-described manner. The gate of each memory cell 11 is connected to a word line 12, and the source and drain thereof are connected to bit lines 13.

As shown in FIG. 1F, in the multi-value flash memory configured in the above-described manner, the $Al_2O_3$ film 3 is provided in each memory cell 11 in plain view, being sandwiched between the two polysilicon films 8 serving as charge storage layers, preventing charge from traveling between these polysilicon films 8. Hence, two-bit operation is stably performed and high reliability is obtained.

Figure 3:
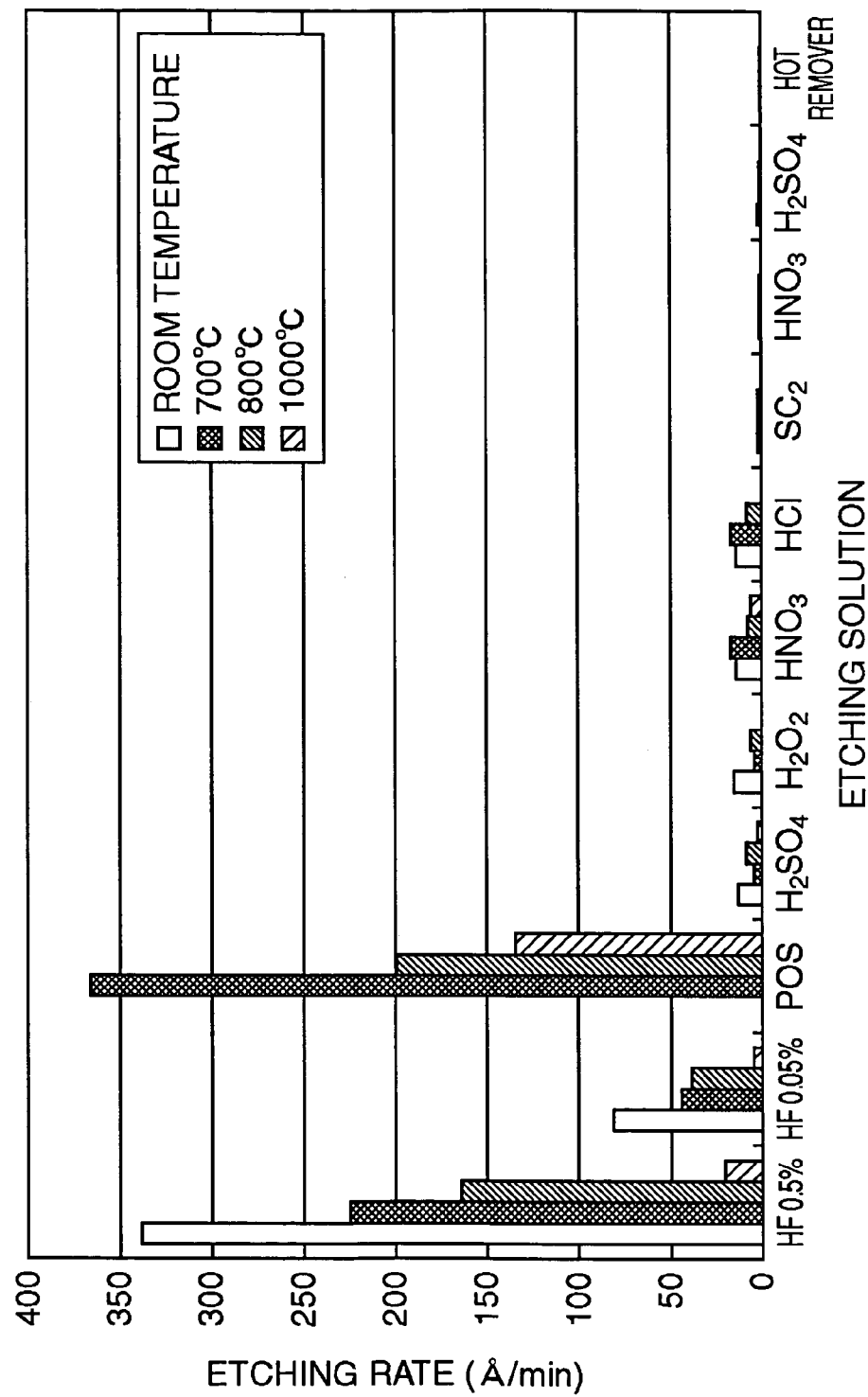
FIG. 3 is a graphical representation showing a relation between treatment solutions and corresponding etching rate of an $Al_2O_3$ film.

Further, the isotropic etching employed in the manufacturing method shows high selectivity ratio to the $Al_2O_3$ film 3; thereby size control of the spaces is extremely facilitated. FIG. 3 is a graphical representation showing a relation between treatment solutions and corresponding etching rate of the $Al_2O_3$ film. In the above-described embodiment, as shown in FIG. 3, the $Al_2O_3$ film 3 is isotropically etched using the solution of sulfuric acid with hydrogen peroxide (POS), and therefore, etching is conducted at a high rate. On the contrary, the silicon oxide film 4, the polysilicon film 5, the cap film 6 and the like are hardly etched by the sulfuric acid with hydrogen peroxide. Consequently, the $Al_2O_3$ film 3 is etched at such a high selectivity ratio that etching amount can be placed under control with extreme ease, therefore throughput and yield are improved.

Note that, as shown in FIG. 3, the $Al_2O_3$ film can be etched at a high rate also by HCl, $HNO_3$, $H_2O_2$, $H_2SO_4$, and HF, whereas, HF cannot be for use therein since the use of HF concurrently removes the silicon oxide film. Although HCl, $HNO_3$, $H_2O_2$, and $H_2SO_4$ can be for use, the solution of sulfuric acid with hydrogen peroxide (POS) is the most preferable one.

Additionally, according to the above-described embodiment, the sidewall oxide films 9 are formed by oxidizing parts of the polysilicon films 8; however, the method for forming a sidewall oxide film is not limited thereto. To cite a case, in the process as shown in FIG. 1D, the sidewall oxide film may be formed through deposition by atmospheric pressure CVD method or the like of the silicon oxide film and etch back thereof after anisotropic etching so performed as to leave the polysilicon films 8 only in the spaces formed under the silicon oxide film 4.

As detailed hereinbefore, according to the present invention, it is possible without fail to insulate a pair of charge storage layers with each other using an $Al_2O_3$ film, enabling stable two-bit operation. In addition, the etching of the $Al_2O_3$ film can be performed at a high selectivity ratio as compared to that of a polycrystalline silicon film, a silicon oxide film, and the like, facilitating the control of the etching amount with extreme ease. As a result, improvement of throughput and yield are enabled.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A semiconductor memory device comprising:
   a semiconductor substrate;
   a tunnel insulating film formed on said semiconductor substrate;
   an $Al_2O_3$ film formed on said tunnel insulating film;
   a pair of charge storage layers sandwiching said $Al_2O_3$ film therebetween in plain view formed on said tunnel insulating film;
   an insulating film formed on said $Al_2O_3$ film and said pair of charge storage layers;
   a gate electrode formed on said insulating film; and
   a source region and a drain region formed as a pair sandwiching said gate electrode in plain view formed on a surface of said semiconductor substrate.

2. The semiconductor memory device according to claim 1, further comprising a sidewall insulating film formed over a side surface of said gate electrode, said insulating film, and said pair of charge storage layers.

3. A semiconductor memory device having a pair of charge storage layers in each memory cell thereof and being capable of storing four values, comprising an $Al_2O_3$ film insulating said pair of charge storage layers with each other.

4. The semiconductor memory device according to claim 1, wherein
   said charge storage layers are composed of a polycrystalline silicon.

5. The semiconductor memory device according to claim 3, wherein
   said charge storage layers are composed of a polycrystalline silicon.

6. The semiconductor memory device according to claim 1, wherein
   said tunnel insulating film has a thickness of 3 nm to 9 nm.

7. The semiconductor memory device according to claim 3, wherein
   a tunnel insulating film has a thickness of 3 nm to 9 nm.

8. The semiconductor memory device according to claim 1, wherein
   said $Al_2O_3$ film and said pair of charge storage layers have a thickness of 5 nm to 15 nm.

9. The semiconductor memory device according to claim 3, wherein
   said $Al_2O_3$ film and said pair of charge storage layers have a thickness of 5 nm to 15 nm.

* * * * *